US011467505B2

(12) United States Patent
Butler et al.

(10) Patent No.: US 11,467,505 B2
(45) Date of Patent: Oct. 11, 2022

(54) HEIGHT SENSOR, LITHOGRAPHIC APPARATUS AND METHOD FOR MANUFACTURING DEVICES

(71) Applicant: ASML NETHERLANDS B.V., Veldhoven (NL)

(72) Inventors: Hans Butler, Best (NL); Johannes Petrus Martinus Bernardus Vermeulen, Leende (NL); Marinus Petrus Reijnders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 740 days.

(21) Appl. No.: 16/346,727

(22) PCT Filed: Oct. 12, 2017

(86) PCT No.: PCT/EP2017/076104
§ 371 (c)(1),
(2) Date: May 1, 2019

(87) PCT Pub. No.: WO2018/082892
PCT Pub. Date: May 11, 2018

(65) Prior Publication Data
US 2020/0057390 A1  Feb. 20, 2020

(30) Foreign Application Priority Data
Nov. 2, 2016  (EP) .................... 16196902

(51) Int. Cl.
*G03F 7/20* (2006.01)
*G03F 9/00* (2006.01)
*H01L 21/027* (2006.01)

(52) U.S. Cl.
CPC ...... *G03F 7/70775* (2013.01); *G03F 7/70641* (2013.01); *G03F 9/7026* (2013.01);
(Continued)

(58) Field of Classification Search
CPC ............ G03F 7/70775; G03F 7/70641; G03F 9/7026; G03F 9/7034; G03F 9/7049; G03F 9/7096; H01L 21/027
See application file for complete search history.

(56) References Cited

U.S. PATENT DOCUMENTS 5,661,548 A  8/1997  Imai
6,674,510 B1  1/2004  Jasper et al.
(Continued)

FOREIGN PATENT DOCUMENTS

CN  1918518 A  2/2007
EP  1 037 117 A2  9/2000
(Continued)

OTHER PUBLICATIONS

International Search Report as cited in the International Application No. PCT/EP2017/076104, dated Mar. 6, 2018.
(Continued)

*Primary Examiner* — Michael A Lyons
*Assistant Examiner* — Amanda Merlino
(74) *Attorney, Agent, or Firm* — Sterne Kessler Goldstein & Fox P.L.L.C.

(57) ABSTRACT

A lithographic apparatus (LA) applies a pattern to a substrate (W). The lithographic apparatus includes a height sensor (LS), a substrate positioning subsystem, and a controller configured for causing the height sensor to measure the height (h) of the substrate surface at locations across the substrate. The measured heights are used to control the focusing of one or more patterns applied to the substrate. The height h is measured relative to a reference height (zref). The height sensor is operable to vary the reference height (zref), which allows a wider effective range of operation. Specifications for control of the substrate height during measurement can be relaxed. The reference height can be
(Continued)

varied by moving one or more optical elements (566, 572, 576, 504 and/or 512) within the height sensor, or moving the height sensor. An embodiment without moving parts includes a multi-element photodetector (1212).

15 Claims, 8 Drawing Sheets

(52) U.S. Cl.
CPC .......... *G03F 9/7034* (2013.01); *G03F 9/7049* (2013.01); *G03F 9/7096* (2013.01); *H01L 21/027* (2013.01)

(56) References Cited

U.S. PATENT DOCUMENTS

| | | | |
|---|---|---|---|
| 6,710,890 | B1 | 3/2004 | Krishnan et al. |
| 6,876,438 | B2 | 4/2005 | Tokita |
| 7,142,366 | B2 | 11/2006 | Okada et al. |
| 7,265,364 | B2 | 9/2007 | Teunissen et al. |
| 7,646,471 | B2 | 1/2010 | Teunissen et al. |
| 7,675,629 | B2 | 3/2010 | Ohsaki et al. |
| 8,947,632 | B2 | 2/2015 | Staals et al. |
| 2003/0230730 | A1 | 12/2003 | Tokita |
| 2005/0134816 | A1 | 6/2005 | Modderman et al. |
| 2007/0085991 | A1 | 4/2007 | Liegl et al. |
| 2010/0171963 | A1 | 7/2010 | Lee et al. |
| 2010/0233600 | A1 | 9/2010 | Den Boef et al. |
| 2013/0201486 | A1 | 8/2013 | Mathijssen et al. |

FOREIGN PATENT DOCUMENTS

| | | |
|---|---|---|
| EP | 1 566 696 A1 | 8/2005 |
| JP | H03-059413 A | 3/1991 |
| JP | H 08-227852 A | 9/1996 |
| JP | 2000-041186 A | 2/2000 |
| JP | 2000-091199 A | 3/2000 |
| JP | 2004-022655 A | 1/2004 |
| JP | 2004-158611 A | 6/2004 |
| JP | 2004-170628 A | 6/2004 |
| JP | 2008-098604 A | 4/2008 |
| JP | 2010-097129 A | 4/2010 |
| JP | 2013-205367 A | 10/2013 |
| JP | 2018-50059 8 A | 1/2018 |
| KR | 1996-0018772 A | 6/1996 |
| WO | 2016/102127 A1 | 11/2015 |

OTHER PUBLICATIONS

International Preliminary Report on Patentability and Written Opinion of the International Searching Authority directed to related International Patent Application No. PCT/EP2017/076104, dated May 7, 2019; 6 pages.

HEIGHT SENSOR, LITHOGRAPHIC APPARATUS AND METHOD FOR MANUFACTURING DEVICES

CROSS-REFERENCE TO RELATED APPLICATIONS

This application is a 35 U.S.C. 371 National Phase of PCT Application No. PCT/EP2017/076104, which was filed on Oct. 12, 2017, which claims priority of EP Application No. 16196902.7, which was filed on Nov. 2, 2016, both of which are incorporated herein in their entirety by reference.

BACKGROUND

Field of the Invention

The present invention relates to methods and apparatus usable, for example, in the manufacture of devices by lithographic techniques, and to methods of manufacturing devices using lithographic techniques. The invention relates more particularly to position sensors and methods for determining the position of a mark on a substrate.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields". Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

In general, the surface of a substrate on which a pattern should be projected is not completely flat. Moreover, a substrate can show thickness variation of several microns. This unflatness and/or thickness variation of the substrate surface may result in incorrect projection of the pattern, for instance due to focus errors or imaging errors. To correct for unflatness and/or thickness variation of a substrate, it is known to use a height sensor (sometimes referred to as a level sensor), desirably integrated in the lithographic apparatus. Such a height sensor may be used to determine a height map of a substrate, before a pattern is transferred, e.g., projected, on the substrate. This height map may subsequently be used to correct the position of the substrate during transfer of the pattern on the substrate, in order to maintain an aerial image of the patterning device in proper focus. It will be understood that "height" in this context refers to a dimension broadly out of the plane to the substrate, and does not imply any particular orientation with respect to Earth or gravity.

Typically, such a height sensor comprises a projection unit to project a measurement beam on the substrate, the projection unit comprising: a projection grating arranged to impart the measurement beam with a substantially periodic radiation intensity; a detection unit, typically comprising two or more detection elements, to receive the measurement beam after reflection on the substrate; and a processing unit to calculate a height level on the basis of the measurement beam parts received by the detectors of the detection unit.

Various height sensors of this general type are disclosed for example in U.S. Pat. Nos. 7,265,364 and 7,646,471 (both Teunissen et al). A height sensor using UV radiation instead of visible or infrared radiation is disclosed in US2010233600A1 (den Boef). In known arrangements, the detection unit of a level sensor may include a detection grating configured to split the reflected measurement beam into different parts which are received by separate sensors. In WO2016102127A1 (Reijnders/ASML), a compact height sensor is described which uses a multi-element detector to detect and recognize the position of a grating image, without needing a detection grating.

Typically, the height sensor makes measurements at a fixed location (relative to its own optical system). The substrate is moved relative to the optical system to obtain height measurements at locations across the substrate. In U.S. Pat. No. 8,947,632B2 a height sensor is disclosed in which moving optical elements cause the measurement location to scan in one or more in-plane directions across a substrate, allowing height measurements to be taken at different locations without requiring a scanning movement of the optical system as a whole, relative to the substrate.

In height sensors based on grating patterns, the grating pitch (together with other factors including magnification in the optical system and angle of incidence on the substrate) determines the sensitivity of the sensor to height variations, but this also limits the range of heights that can be measured to a relatively very narrow range. In the known apparatuses, the position of the substrate is finely controlled during the scanning of the height sensor, so that the distance from the sensor to the surface always remains within the range. However, this is a constraint on the applicability of the sensor. For example, it might be desired to provide an apparatus which does not require such fine control of the substrate height, yet the range of height variations of the substrate surface could exceed the range of current sensor designs. Increasing the grating pitch would widen the range, but would directly degrade the accuracy of height measurements.

SUMMARY OF THE INVENTION

The present invention in a first aspect aims to allow accurate height measurements of a substrate to be made without requiring fine control of the position of the substrate surface during measurements.

The invention in a first aspect provides a height sensor comprising an optical system configured to deliver radiation to a substrate and to collect radiation reflected from the substrate, and to process the collected radiation to derive a measurement of a surface height of the substrate relative to a reference height, wherein the height sensor includes an arrangement for adjusting said reference height relative to a reference structure to which the optical system is connected, while measuring the height at one or more locations across the substrate.

In an embodiment a controller is provided for adjusting the reference height automatically at least partly in response to measurements of a position of a substrate support relative to the reference structure.

In an embodiment a controller is provided for adjusting the reference height automatically at least partly by tracking excursions of the measured height of the substrate.

In some embodiments, a multi-element detector is provided for detecting the collected radiation, wherein signals from selected elements are combined to derive said measurement and wherein the reference height is adjusted wholly or partially by selecting different elements within the multi-element detector. In a further embodiment, while measuring the height at one or more locations across the substrate, the reference height is adjusted solely by selecting different elements within the multi-element detector. In another further embodiment the collected radiation is focused to form an image of a grating pattern on the multi-element detector, and wherein a pitch of elements in the multi-element detector is two or more times, optionally four or more times, a pitch of the grating pattern on the multi-element detector.

In other embodiments, the arrangement for adjusting the reference height includes one or more movable elements in said optical system. The number of movable elements may be only one or two, or substantially the entire optical system may be movable. In a further embodiment at least one movable optical element comprises an element for directing said radiation from a projection focusing subsystem to the substrate. In a further embodiment at least one movable optical element comprises an element for directing the collected radiation from the substrate into a detection focusing subsystem. In a further embodiment said movable element is arranged to translate without changing angle, so as to vary said reference height without varying an incidence angle of the radiation at the substrate. In a further embodiment said at least one movable optical element is an element for directing the collected radiation from a detection focusing subsystem to a sensor subsystem. In a further embodiment said at least one movable optical element is a grating for applying a grating pattern to the radiation delivered to the substrate. In a further embodiment said at least one movable optical element is a detection grating for interacting with a grating pattern in the collected radiation. In a further embodiment said movable optical elements include both a grating for applying a grating pattern to the radiation delivered to the substrate and a detection grating for interacting with a grating pattern in the collected radiation.

In an embodiment an in-plane location at which said height measurement is made, relative to the optical system of the height sensor, is substantially independent of the adjusted reference height.

In an embodiment an in-plane location at which said height measurement is made deviates with the adjusted reference height. In a further embodiment a measurement of height is output together with information allowing the deviation of the in-plane location to be identified. In a further embodiment an in-plane location of the substrate relative to the substrate is controlled to compensate for a deviation caused by adjustment of the reference height, so as to obtain a measurement substantially at a desired location.

In an embodiment adjusting the reference height comprises selecting a measurement time while the optical system cycles through a range of states corresponding to different reference heights.

In an embodiment adjusting the reference height comprises selecting a height measurement from a succession of height measurements made with different reference heights.

The invention further provides a method of manufacturing devices wherein a device pattern is applied to a substrate using a lithographic process, the method including focusing the applied pattern on a surface of the substrate by reference to heights measured across the substrate, the measured positions being obtained using a height sensor according to the invention as set forth above.

The invention further provides a lithographic apparatus for use in applying a pattern to a substrate, the lithographic apparatus including a height sensor according to the invention as set forth above, a substrate positioning subsystem, and a controller configured for causing the height sensor to measure the height of the substrate surface at locations across the substrate, and for using the measured heights to control the focusing of one or more patterns applied to the substrate. In an embodiment, at least with regard to a height direction, the substrate positioning subsystem implements a single level of actuation, as opposed to coarse and fine levels of actuation.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

Figure 2:
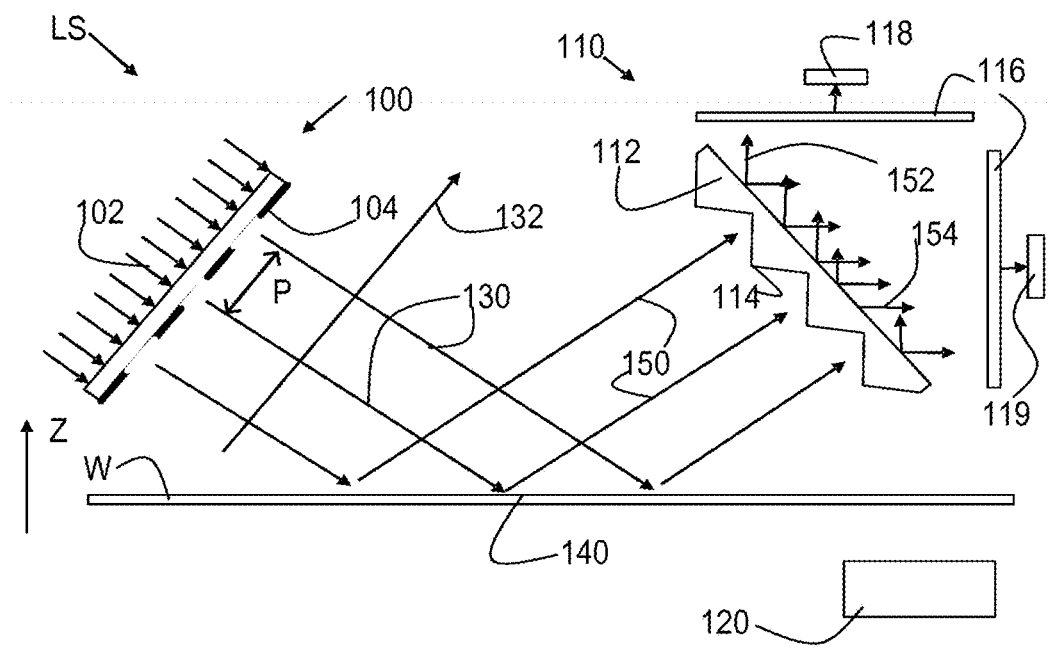
FIG. 2 illustrates the principles of operation of a height sensor according to some embodiments of the present invention.
Figure 12:
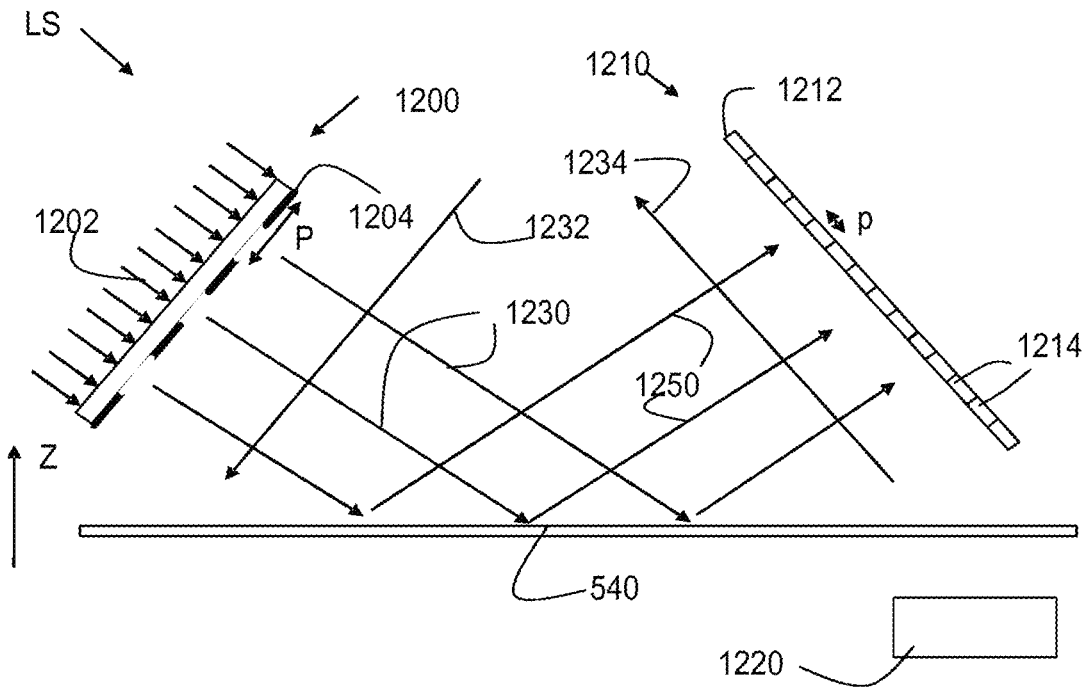
FIG. 12 illustrates the principles of operation of a height sensor of the type disclosed in WO2016102127A1
Figure 13:
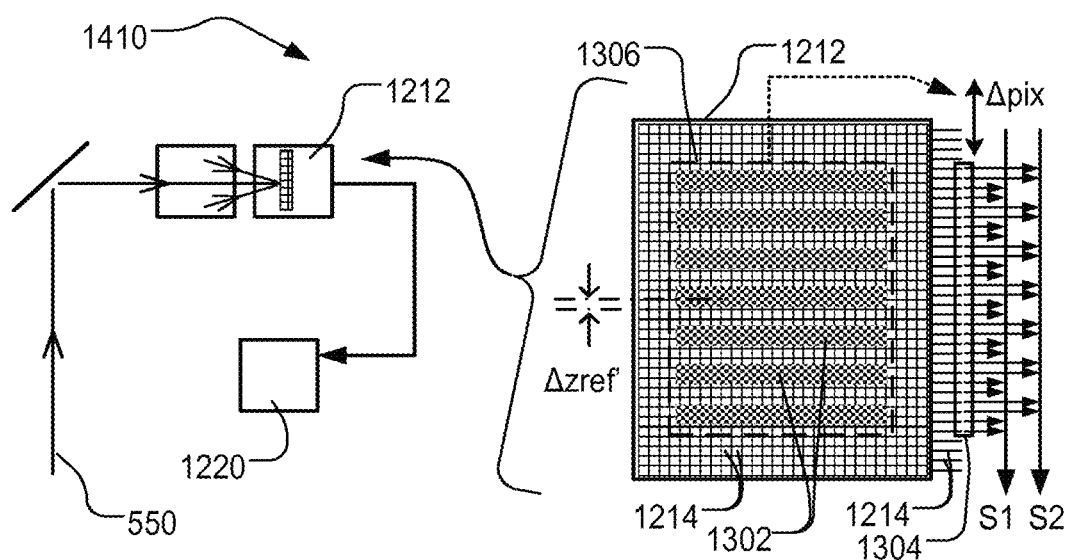
Figure 14:
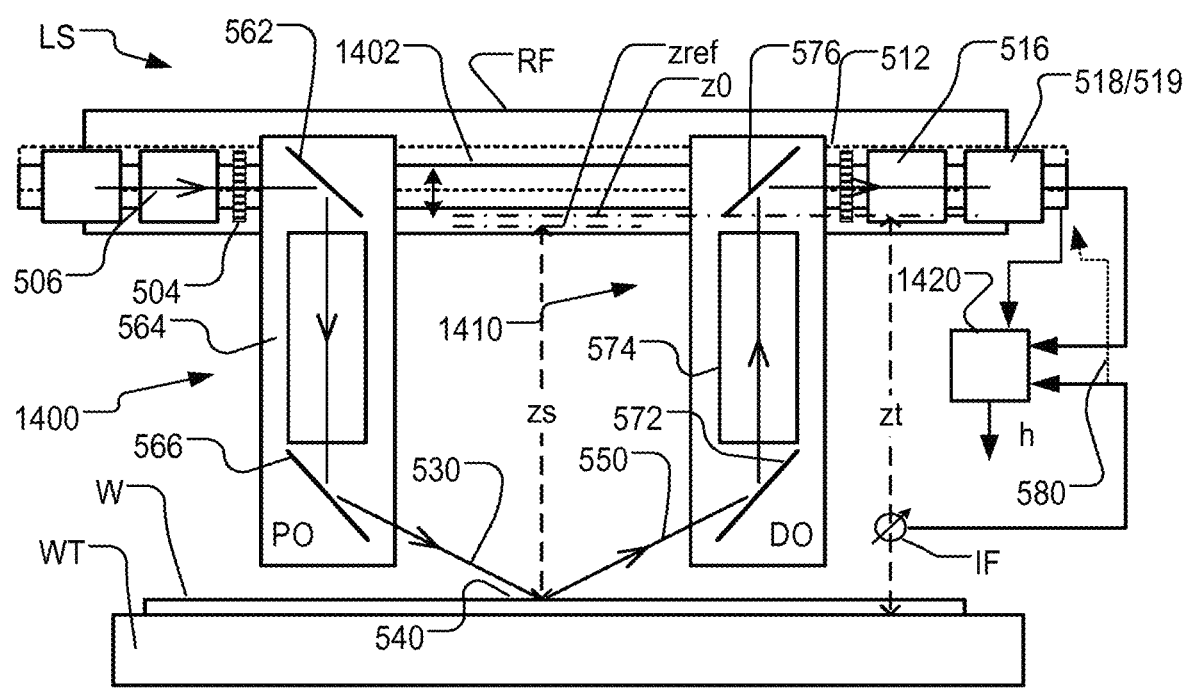

(Reijnders/ASML), which can be used in place of the height sensor illustrated in FIG. 2 to make further embodiments of the present invention;

FIG. 13 schematically the components of a modified height sensor based on the height sensor of FIG. 12, operating in accordance with a sixth embodiment of the present invention; and FIG. 14 shows schematically the components of a modified height sensor operating in accordance with a seventh embodiment of the present invention.

DETAILED DESCRIPTION OF EMBODIMENTS

Before describing embodiments of the invention in detail, it is instructive to present an example environment in which embodiments of the present invention may be implemented.

Figure 1:
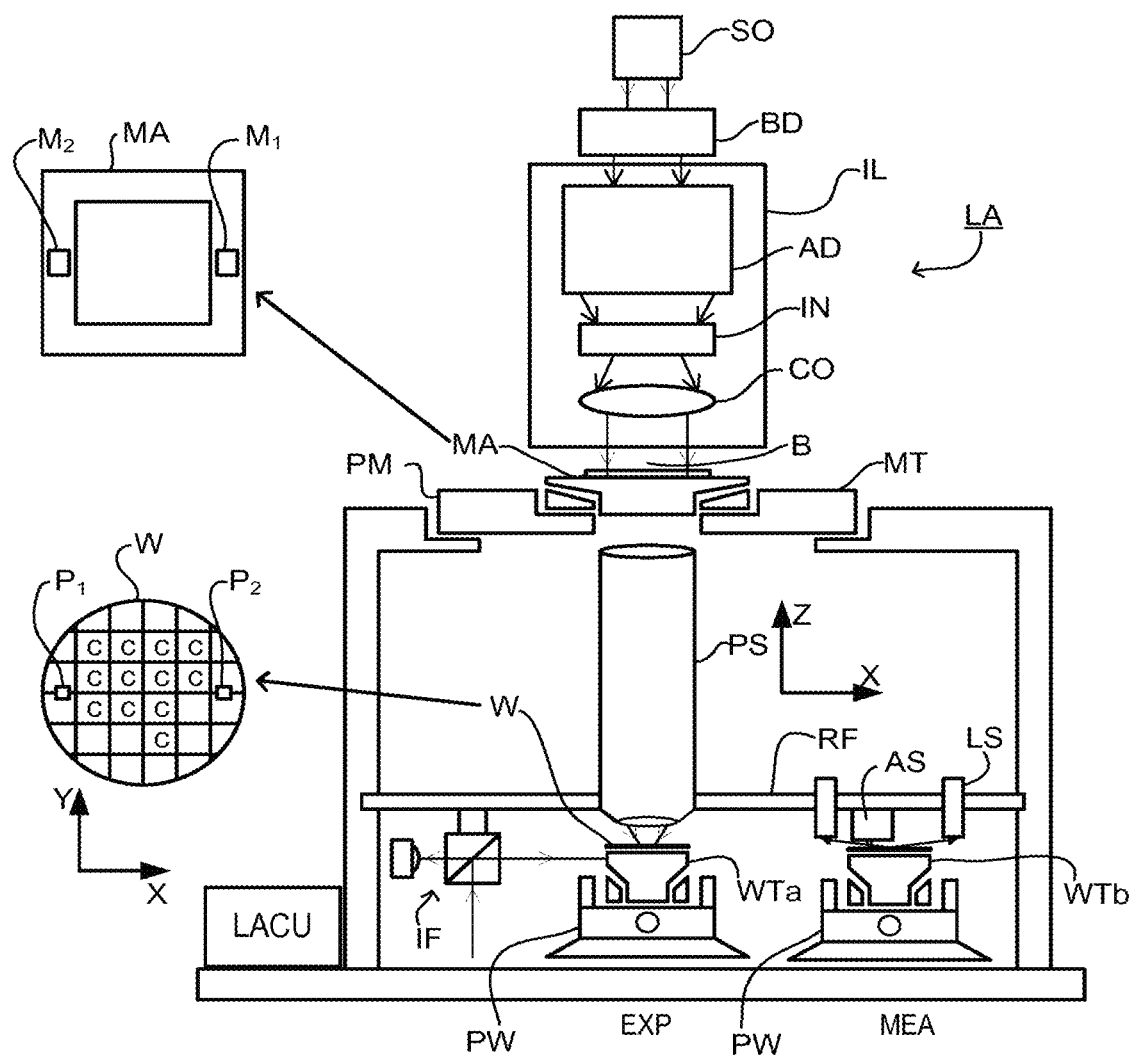
FIG. 1 depicts a lithographic apparatus in which a height sensor according the present invention may be used.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

In FIG. 2, a height sensor as known in the art is schematically shown. The height sensor LS is configured to determine a height map of a substrate W. This height map may be used to correct the position of a substrate during projection of a pattern on the substrate W. The height sensor comprises an optical system which includes a projection unit 100 and a detection unit 110. The height sensor also includes a processing unit 120. The projection unit 100 comprises a light source providing a light beam 102 which is imparted by a projection grating 104 of the projection unit 100. The light source may be for example a narrowband or broadband light source, polarized or unpolarized, pulsed or continuous. The light source may for example be a polarized or non-polarized laser beam. The light source may include a plurality of light sources having different colors, such as a plurality of LEDs. Note that, in the context of the present disclosure, references to "light" should not be interpreted as being restricted to visible light, but will be understood to encompass ultraviolet (UV) radiation and any type of radiation suitable to reflect on the surface of a substrate. A height sensor adapted to use UV radiation is disclosed for example in US2010233600A1 (den Boef et al)

The projection grating 102 as shown is a periodic grating, having a periodic structure resulting in a measurement beam 130 having a periodically varying intensity. In particular, the intensity of the patterned measurement beam varies periodically along the direction indicated by the arrow 132. The measurement beam 130 with the periodically varying intensity is directed towards a measurement location 140 on the substrate W. At the measurement location 140, the measurement beam is reflected by the substrate (indicated by arrows 150) towards the detection unit 110. In practice, the optical system will include further optical elements along the path of the patterned measurement beam between the projection unit 100 and the detection unit 110. These further elements are omitted in FIG. 2, which illustrates only the principles of operation. These further elements can be used to implement modifications of the height sensor, as described below.

The detection unit 110 comprises a detection grating 112 comprising in this example a grating of triangular features 114 to split the reflected measurement beam 150 and direct portions of the received reflected measurement beam 150 to two distinct directions 152, 154. The redirected beams (along directions 152 and 154) are subsequently received by focusing optics 116 of the detection unit 110, the focusing optics 116 being configured to image the received redirected beams onto separate photodetectors 118, 119 of the detection unit 110. The signals generated by the photodetectors 118, 119 are subsequently provided to the processing unit 120 of the height sensor LS. The processing unit 120 is further configured to determine a height h of the substrate W, i.e. a position of the substrate in the indicated Z-direction, based on the signals received.

It should be understood that other forms of detection units are known, and the one illustrated is only one example. As another example, the published patent application US2010233600A1 describes an earlier type of height sensor based on a differential detection scheme. In such a known detection scheme a combination of a polarizer and shear plate (e.g. in the form of a Wollaston prism) produces two laterally sheared grating images from the reflected beam on a reference grating. The resulting images are transmitted by a reference grating and detected by two detectors. These signals are processed to yield a height signal, in a manner similar to the design of FIG. 2. The design of FIG. 2 is favored for height sensors using UV radiation, because of the high cost of the polarizing components of the known design.

Figure 3:
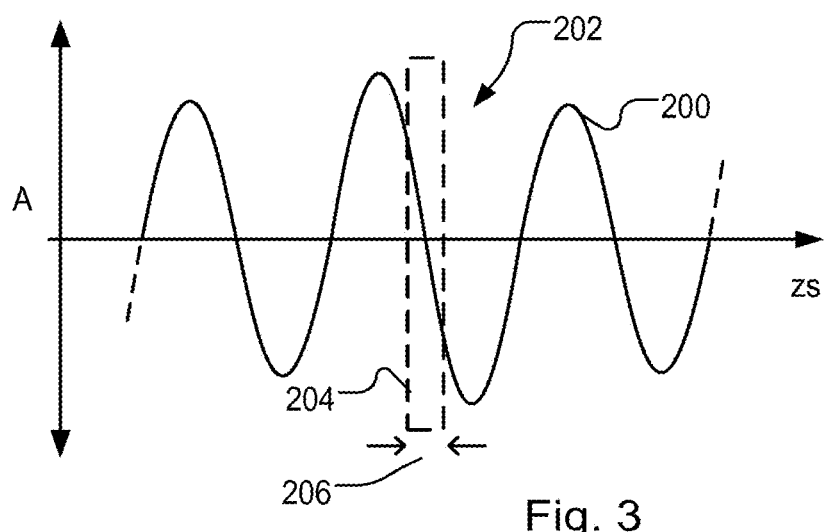
FIG. 3 illustrates a sensing range of the height sensor of FIG. 2.

FIG. 3 illustrates the form of signals obtained in the processing unit 120 of the height sensor of FIG. 2. The horizontal axis represents the height zs of the sensor relative to the substrate W. The vertical axis represents the asymmetry A, obtained as a difference between the signals generated by the two photodetectors 118, 119. As the height zs varies, can be seen from FIG. 2 that bright fringes of the grating pattern generated by projection grating 104 are projected on different portions of the triangular features 114 of the detection grating. The asymmetry signal A swings to positive and negative values, depending on whether the bright fringes are predominantly illuminating photodetector 118 or photodetector 119. This causes a near-sinusoidal variation, of the form illustrated by the curve 200 in FIG. 3. Because the gratings are not infinite, the amplitude of the variations is greatest in the central portion 202 of the curve, and the height sensor is designed to operate exclusively in the region of this central portion, where the asymmetry signal A shows an approximately linear variation with height zs. This operating region is approximately bounded by the box 204. The pitch of the projection grating and detection grating therefore determines the period of the sinusoidal variation, and consequently limits the operating range 206 of the height sensor. The pitch of the projection grating also determines the slope of the linear portion of the curve 200 within the operating range, and therefore determines the sensitivity of the height sensor.

Figure 4:
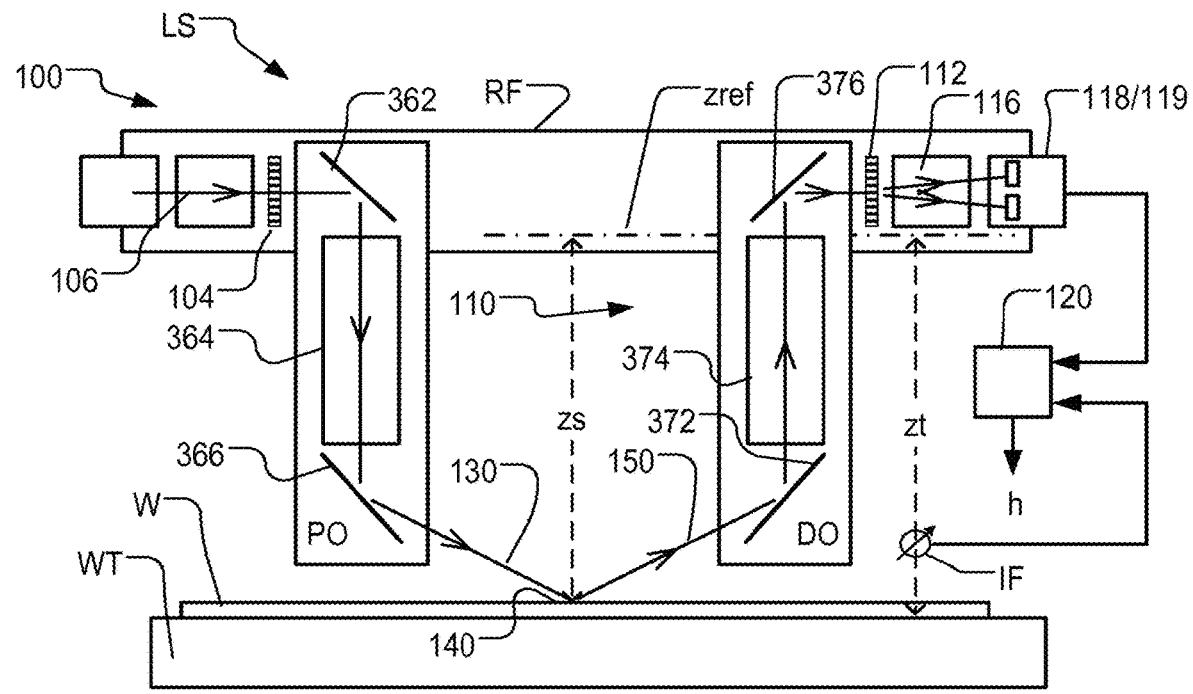
FIG. 4 shows schematically the components of a height sensor operating in conjunction with a substrate in the apparatus of FIG. 1 according to a known arrangement.

Referring now to FIG. 4, a physical arrangement of components of the height sensor LS is shown, relative to the reference frame RF and the substrate support WT in a lithographic apparatus, for example of the type shown in FIG. 1. In the case of a dual stage apparatus, substrate support WT in FIG. 4 could be either the substrate supports WTa or WTb. Components of the height sensor already shown in FIG. 2 are labeled in FIG. 4 with the same reference numerals. Thus the projection unit 100 and detection unit 110 are shown as being mounted on the reference frame, and including the projection grating 104 and the detection grating 112 respectively. While these components are shown mounted individually on the reference frame RF, it will be understood that a height sensor frame could be provided, which in turn is mounted to the reference frame RF of the lithographic apparatus.

Also shown in FIG. 4 are additional components of the optical system, not shown in FIG. 2. These components are for conditioning and focusing the light beams, while others are for folding the optical system into a compact arrangement. Using curved reflectors or prisms, focusing and folding functions can be combined in a single element. These functions are represented schematically in FIG. 4, while their detailed implementation will of course vary between different implementations. In the projection unit 100, for the sake of example, an entrance mirror 362 is shown folding the path of the measurement beam 130 and directing it into a projection focusing unit 364. An exit mirror 366 diverts measurement beam 130 to an angle suitable for impinging on the substrate W at the measurement location 140. Similarly, in the detection unit 110, an entrance mirror 372 diverts the reflected beam 150 into a detection focusing unit 374. An exit mirror 376 diverts the path of the reflected beam towards the detection grating 112 and focusing unit 116.

In the known arrangements, a reference height zref of the height sensor is fixed relative to the reference frame RF of the lithographic apparatus. The height value zs is expressed, or defined, relative to this reference height. Referring again to FIG. 3, known height sensors have an operating range of, for example, a few microns. During measurement of the height at different locations across the substrate, the height of the substrate is controlled by the positioning subsystems of the lithographic apparatus in order to maintain the surface within the operating range of the height sensor. The variations in height zt of the substrate support, which is relative to the reference frame RF, are measured with high accuracy using the position sensor IF (shown also in FIG. 1). These height variations can be added or subtracted to the variation in height zs measured by the height sensor, so as to obtain an overall height value h for the substrate surface relative to the substrate support.

It will be appreciated that the limited operating range of the height sensor places strict requirements on the positioning subsystems that determine the height of the substrate table WT and substrate W during measurement of a height map at locations across the substrate. Providing a height sensor with increased operating range would relax design constraints on the rest of the apparatus as will be illustrated below. With the known design, to increase the operating range implies a corresponding decrease in sensitivity, which may not be acceptable.

Figure 5:
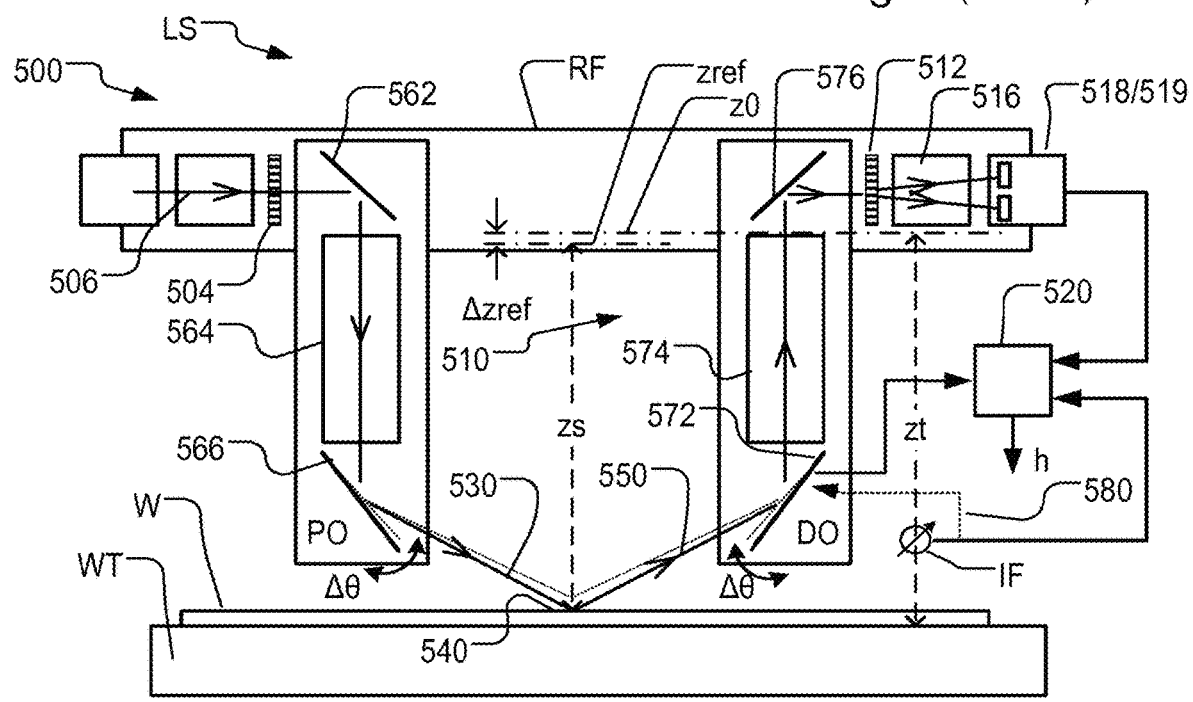
FIG. 5 shows schematically the components of a modified height sensor in accordance with a first embodiment of the present invention.

FIG. 5 illustrates schematically the components of a first example of a modified height sensor in which the optical system of the height sensor contains all the same elements of the known height sensor of FIG. 4. Elements 502-550 correspond to elements 102-150 of the height sensor of FIG. 4 and operate in substantially the same manner Elements 562-576 correspond to elements 362-376 of the height sensor of FIG. 4 and operate in substantially the same manner.

The modified height sensor differs functionally from the one of FIG. 4, in that the reference height zref, from which the height zs of the substrate is measured, is variable during the course of measurements across the substrate. The reference height zref can vary by an amount $\Delta$zref with respect to a fixed reference height z0, which is defined by the reference frame RF. The variable reference height zref can in particular be controlled to track variations in the height zt the substrate support, so that the measured height zs is kept within the operating range of the height sensor. Combining the three values $\Delta$zref, zs and zt, the height of the substrate surface relative to the fixed reference z0 is measured with the same accuracy as before. The accuracy of positioning the substrate relative to the reference frame RF is, however, relaxed.

Several implementations giving rise to this function of a variable reference height are disclosed in the examples described below. In a first type of example, the variation of the reference height zref is achieved by physically moving one or more elements of the optical system. The optical system may comprise numerous lenses, curved mirrors, planar mirrors, prisms, gratings and the like, any of which may be a candidate for selection as a movable element.

In the example of FIG. 5, variation in the reference height zref is achieved by tilting the exit mirror 566 of the projection unit 100 by a small angle $\Delta\theta$ and by tilting the entrance mirror 572 of the detection unit 110 by a similar angle. This causes the measurement beam 530 to be reflected at a measurement location 540 which is lower, i.e. further from the reference frame RF, than the original location, indicated in dotted lines. Tilting of the mirrors can be effected by any suitable actuator, under control of processor 520 or another controller not shown. Because both mirrors tilt by the same amount, the path of the reflected beam within the focusing optics 574 and subsequent elements 376, 512, 516 is unaffected. The in-plane (x, y) position of the measurement location 540 is also unaffected. However, through variation of $\Delta$zref, the reference height zref varies in a predictable way with the tilt angle $\Delta\theta$. By suitable equations or by look-up tables, processor 520 (or another controller not shown) calculates the variation $\Delta$zref from the positions of the mirrors. The variation can be controlled automatically by tracking the variation of the asymmetry signal A during operation, to keep it close to the center of the operating range. Alternatively, or in addition, a control connection 580, shown dotted, can be made between the measured height zt of the substrate table WT and the variation of the reference height by tilting the mirrors 566, 572.

Processor 520, or a separate processor, can operate as a controller for adjusting the reference height automatically in this way. As just explained, the height adjustment can be made at least partly in response to measurements of the position of a substrate support relative to the reference structure. In other embodiments, the controller is arranged to adjust the reference height automatically at least partly by tracking excursions of the measured height of the substrate. The same principles apply among the examples to be described below. That is to say, the variation of reference height can be controlled entirely within the height sensor in response to measured height zs. Provided that processor 520 receives signals from which the variation of reference height is known or can be calculated, a height measurement relative to the fixed reference height z0 can be calculated. Alternatively, or in addition, the variation of the reference height can be controlled partly by reference to measurements of the substrate position, such as are received from whatever sensor is the equivalent in a given implementation. In embodiments where the positions of the reference height and the substrate support are controlled by servo controllers, these may already have the necessary measurements at hand. In some embodiments the movable elements may be controlled based on the measurement of zs itself. In such a case, position encoders for the movable elements may not be required since measured height zs itself can serve a feedback signal for the control loop. Position encoders may still be desirable, of course, for example as a fallback in case no substrate is positioned within the range of the sensor.

Figure 6:
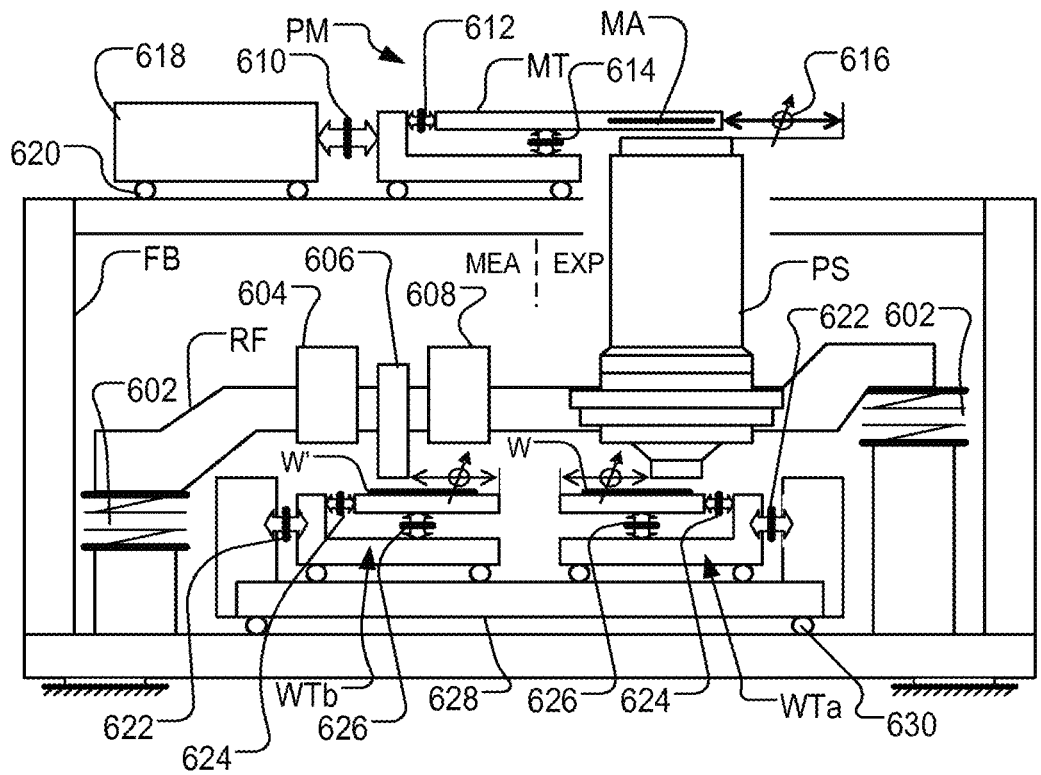
FIG. 6 illustrates schematically the components of a known lithographic apparatus having separate measurement and exposure stages, usable in embodiments of the invention.

FIG. 6 shows schematically the overall mechanical arrangement of one embodiment of the apparatus of FIG. 1, in which the apparatus is of the type having dual substrate supports and separate measurement station MEA and exposure station EXP.

A base frame FB supports and surrounds the apparatus on the floor. Within the apparatus, and serving as an accurate positional reference, a reference frame RF is supported on air bearings 602, which isolate it from vibrations in the environment. Mounted on this frame are the projection system PS, which naturally forms the core of the exposure station EXP, and also instruments 604, 606, 608, which are the functional elements of the measurement station MEA. In the present example instruments 604 and 608 are the projection unit 100 and detection unit 110 of the height sensor LS. Instrument 606 is alignment sensor AL. Above the exposure station EXP, the mask table MT and mask MA are mounted above the projection system PS. The first positioner PM comprises long-stroke (coarse) actuators 610 and short-stroke (fine) actuators 612, 614. These operate by active feedback control to obtain the desired position of mask MA with respect to the projection system PS, and hence with respect to the reference frame RF. This measurement is indicated schematically at 616. A balance mass 618 is provided to mimic at least coarse movements of the mask table MT and first positioner PM, to reduce vibrations being transmitted into the frame and other components. The balance mass 618 is supported on the base frame FB via active air bearings 620. A low frequency servo control keeps balance mass 618 in a desired average position. According to the dual-stage arrangement of this example, substrate supports in the form of wafer tables WTa and WTb are provided, each with an associated positioning mechanism. Wafer table WTa is shown at the exposure station loaded with a wafer W while wafer table WTb is shown at the measurement station carrying a next wafer W'. Each wafer table has coarse actuators 622 and fine actuators 624, 626 for positioning substrate W accurately with respect to the instruments 604-608 and with respect to the exit lens of the projection system PS. Wafer tables WTa, WTb and their respective positioning subsystems are carried on and connected to a shared balance mass 628. Again, air bearings, or other suitable bearings such as magnetic, electrostatic and so forth, are shown schematically, for example at 630. Measurements of wafer table position used for the coarse and fine control of the positions of the wafers W and W' are made relative to instruments 604-608 at the measurement station and projection system PS at the exposure station, both of these ultimately referring back to the reference frame RF.

Referring now to operation of the height sensor formed by instruments 604 and 608 in the known lithographic apparatuses, use of the modified height sensor with a variable reference height zref relaxes the constraints on the fine actuators 626 which otherwise would have to maintain the substrate surface within the operating range of the height sensor.

Figure 7:
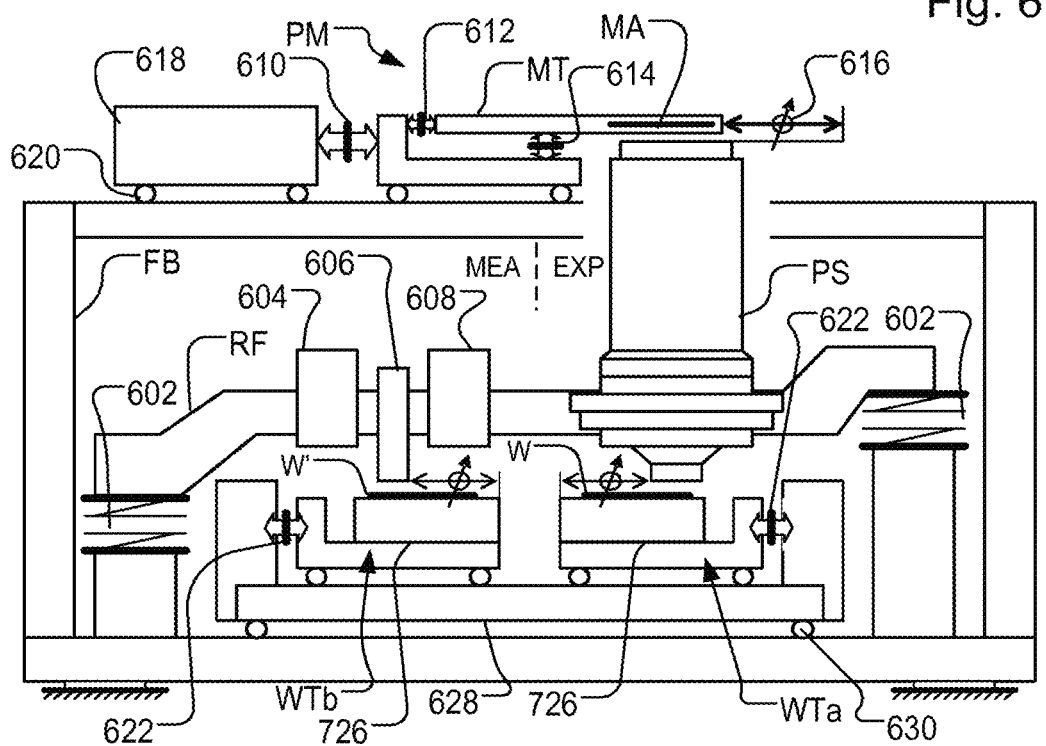
FIG. 7 illustrates schematically the components of a modified lithographic apparatus according to further embodiments of the present invention.

Furthermore, if the range of the variation of the reference height is sufficient, a lower-cost lithographic apparatus can be constructed, as shown in FIG. 7. The mechanical arrangement of this modified lithographic apparatus is identical to that of FIG. 6, except that fine actuators 624, 626 have been replaced by fixed mountings 726. All movements of the wafer tables WTa, WTb are then controlled only using the coarse actuators 622. However, the measurement of position is still accurate. The operating range of the height sensor has effectively been extended without compromising its sensitivity, allowing a lower cost positioning subsystem for the wafer tables.

Alternative embodiments of the modified height sensor will now be described, with references to FIGS. 8 to 14. Each of these modified height sensors can be deployed in a lithographic apparatus in the same manner as described above. Each of these modified height sensors can be deployed in a lithographic apparatus having one or more substrate supports, and not only a dual stage apparatus of the type shown in FIGS. 1, 6 and 7. Each of these sensors can be deployed in a lithographic apparatus having both coarse and fine actuators, and a lithographic apparatus having only coarse actuators, as shown in FIG. 7. Each of these sensors can also be deployed in other types of apparatus including inspection apparatus used in semiconductor manufacture, and in other types of inspection apparatus.

The first embodiment of a modified height sensor shown in FIG. 5 adjusts the reference height by tilting the mirrors 566 and 572, as described above. Accordingly, when the reference height is adjusted, also the angle of incidence of the measurement beam 530 changes. With some types of substrate, this variation of angle of incidence may lead to variation of the reported height. This could lead to variable inaccuracies in the height measurement, although these could be addressed by a suitable variable calibration.

Figure 8:
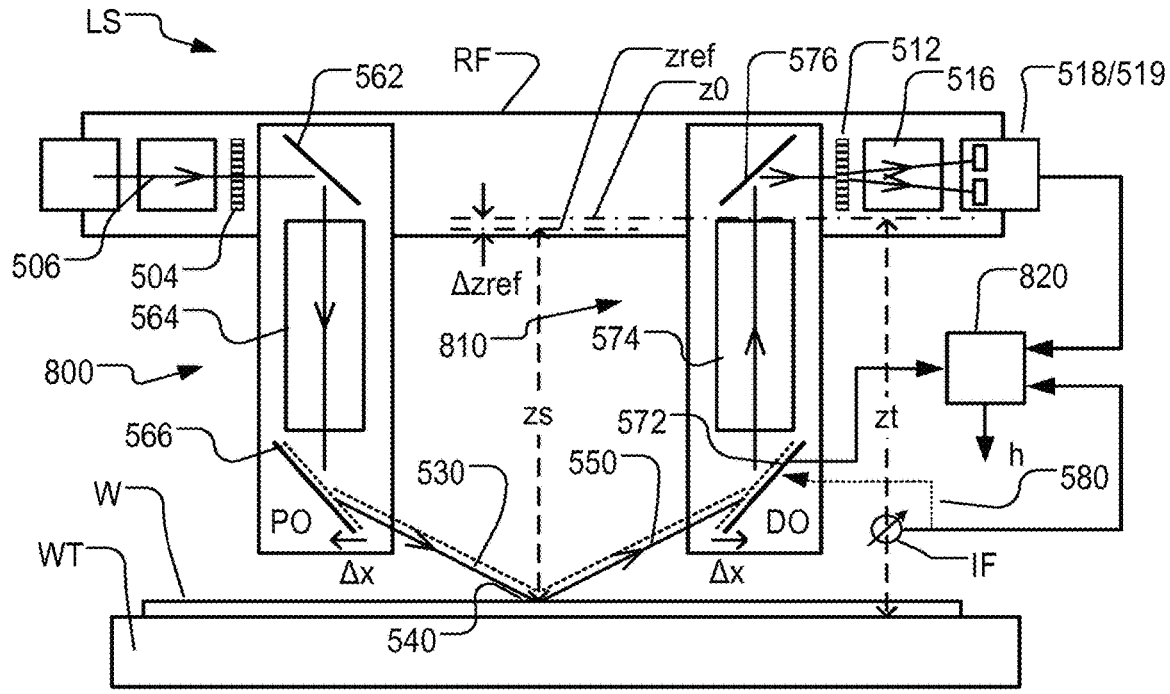
FIG. 8 shows schematically the components of a modified height sensor operating in accordance with a second embodiment of the present invention.

FIG. 8 shows a second embodiment of a modified height sensor, having a projection unit 800, a detection unit 810 and a processor 820. All components shown within these units can be the same as in FIG. 5, except for the differences described below, and the same reference signs are used as in FIG. 5.

The height sensor of FIG. 8 includes movable optical elements to achieve the variation of reference height zref, and these movable optical elements are again the exit mirror 566 of the projection unit and the entrance mirror 572 of the detection unit. Rather than tilting or rotating, however, the adjustment of reference height is implemented by linear motion of the mirrors by an amount Δx as shown. The effect of this is that the change Δzref in the reference height is achieved without changing the incidence angle of the measurement beam 530. Therefore problems of inaccuracy caused by variation of process dependency with angle of incidence are avoided. Variable calibration is avoided. The arrangements for driving and controlling the movable element and for calculating the combined height measurement can be the same as described above for FIG. 5.

Figure 9:
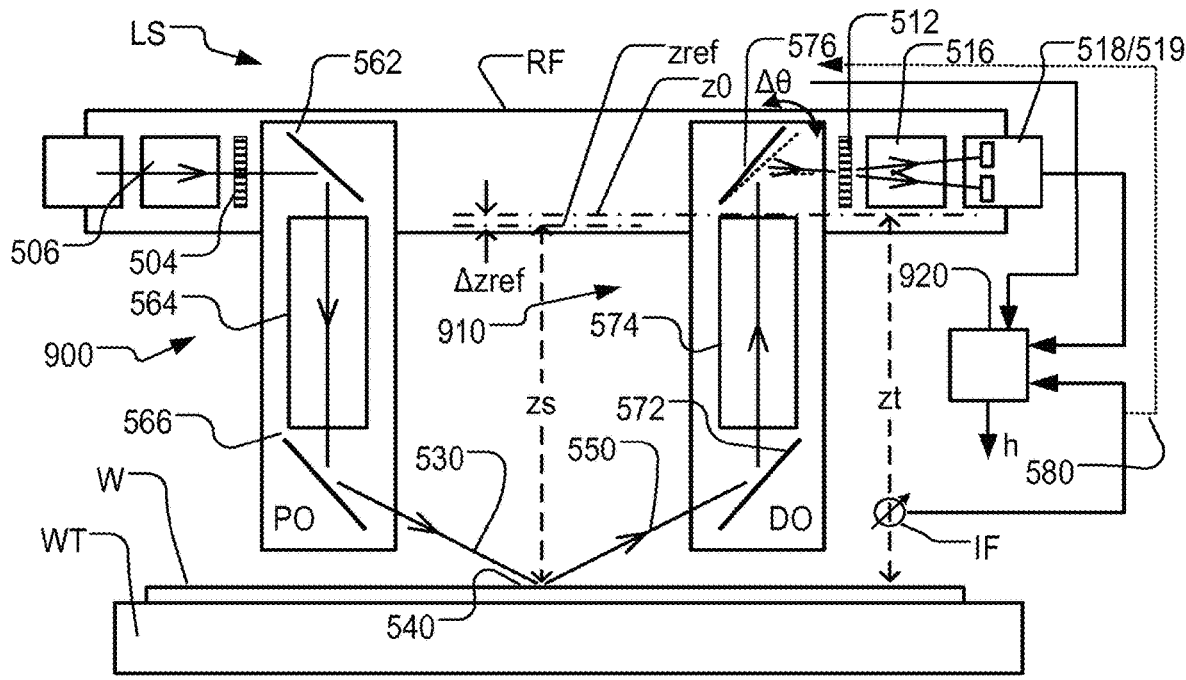
FIG. 9 shows schematically the components of a modified height sensor operating in accordance with a third embodiment of the present invention.

FIG. 9 illustrates a third embodiment of a modified height sensor, having a projection unit 900, a detection unit 910 and a processor 920. All components shown within these units can be the same as in FIG. 5, except for the differences described below, and the same reference signs are used as in FIG. 5. Compared with the examples of FIGS. 5 and 8, in this example the mirrors 566 and 572 are fixed (or at least they do not move for the purposes of adjusting the reference height for the height sensor). Instead, the exit mirror 576 is controlled to tilt or rotate by a variable amount Δθ. The position at which the image of the projection grating 504 falls on the detection grating 512, for a given height zs, is therefore varied. At the same time, the angle of incidence of the measurement beam on the substrate is unchanged, avoiding the problems mentioned in the example of FIG. 5. The number of actuators and control loops is also reduced. The arrangements for driving and controlling the movable element and for calculating the combined height measurement can be the same as described above for FIG. 5. Compared with the examples of FIGS. 5 and 8, in the example of FIG. 9 the mirrors 566 and 572 are fixed (or at least they do not move for the purposes of adjusting the reference height). Compared with the examples of FIGS. 5 and 8, the example of FIG. 9 requires only a translation of a single moving element.

Figure 10:
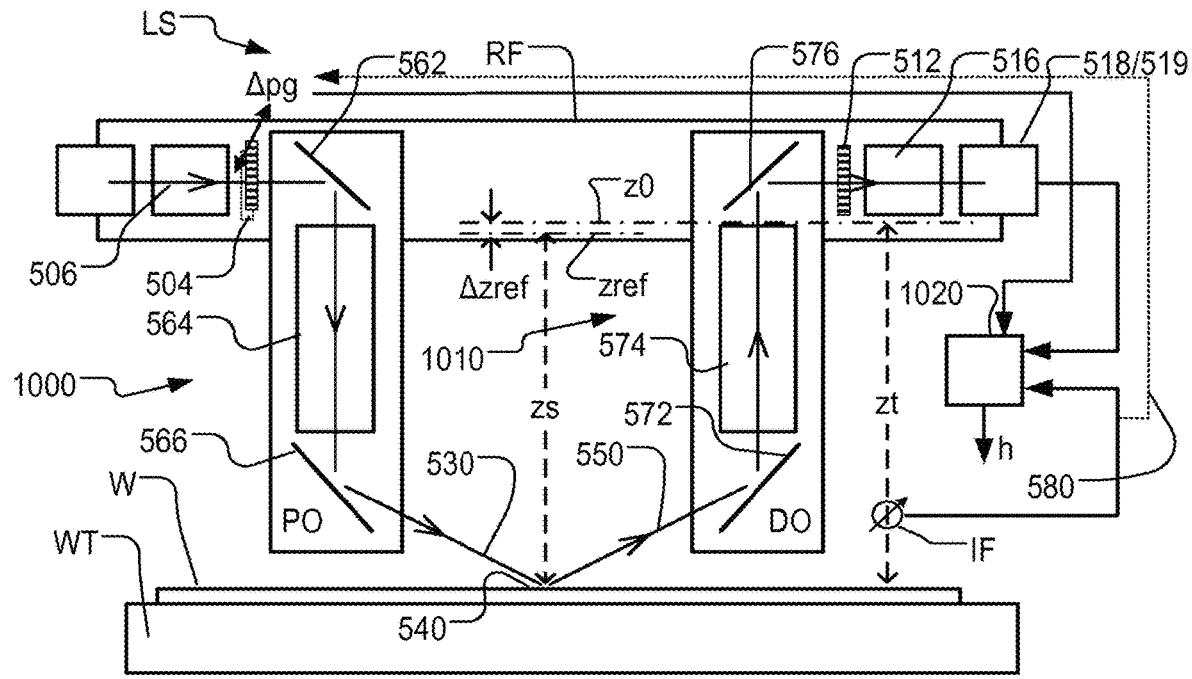
FIG. 10 shows schematically the components of a modified height sensor operating in accordance with a fourth embodiment of the present invention.

FIG. 10 illustrates a fourth embodiment of a modified height sensor, having a projection unit 1000, a detection unit 1010 and a processor 1020. All components shown within these units can be the same as in FIG. 5, except for the differences described below, and the same reference signs are used as in FIG. 5. Compared with the examples of FIGS. 5 and 8, in this example the mirrors 566, 572 and 576 are fixed (or at least they do not move for the purposes of adjusting the reference height for the height sensor). In this example, the position of projection grating 504 is controlled to translate by a variable amount Δpg, as shown. The position at which the image of the projection grating 504 falls on the detection grating 512, for a given height zs, is therefore varied, causing the desired change Δzref of the reference height. Compared with the examples of FIGS. 5 and 8, the example of FIG. 10 requires only a translation of a single moving element. As indicated by the arrow representing movement Δpg shown on the diagram, the translation direction may be slightly angled relative to the plane of the grating. This is to maintain a constant optical path length and keep the image of the projection grating focused on the detection grating. Other measures may be taken if necessary.

As mentioned, the arrangements of FIGS. 9 and 10 offer simplicity by requiring only a single actuator and movable element. A complication of these arrangements is that the in-plane position of the measurement location 140 (i.e. the position in the x or y direction) becomes variable, relative to the reference frame RF. Accordingly, if the in-plane position of the substrate is scanned in the same way as the conventional height sensor, the measurements obtained will not correspond to the expected locations. This in-plane deviation of the measurement location can be taken into account in a number of ways, however. A first option would be to control the relative positions of the substrate and the height sensor so that the measurement location 540 is actually the expected location. This can be achieved by controlling the position of the substrate table or by additional mechanisms within the height sensor that vary the in-plane measurement location. The U.S. Pat. No. 8,947,632 mentioned above discloses mechanisms for varying the measurement location without physically shifting the height sensor and substrate relative to one another. Variations of those mechanisms could be used to compensate the (relatively very small) in-plane deviation caused by movement of the projection grating, so that the measurement location is as expected.

Another option is for the processor 520 to mathematically correct the height map after it has been measured, and thus to obtain an estimate of the height at the expected location. A third option is for the height map to be delivered with information of the actual measurement locations. A controller for the exposure station can take the in-plane deviations into account when controlling the projection system to apply patterns with correct focus.

Apart from the complication of in-plane deviation of the measurement location, the arrangements for driving and controlling the movable element and for calculating the combined height measurement can be substantially the same as described above for FIG. 5.

Figure 11:
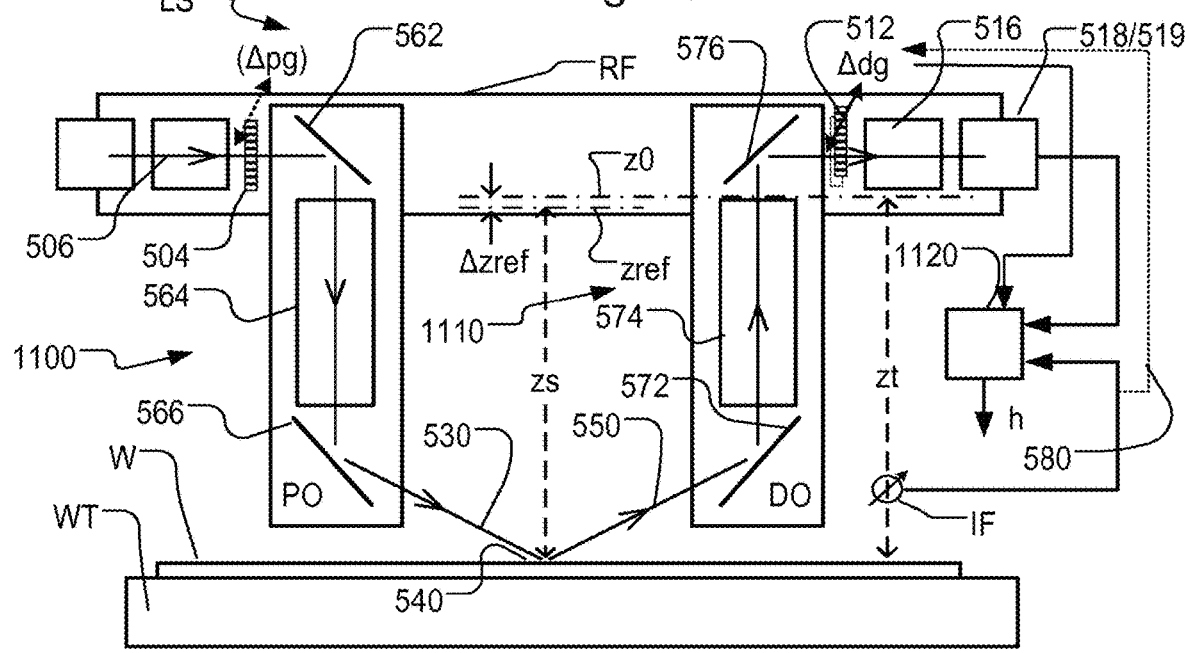
FIG. 11 shows schematically the components of a modified height sensor operating in accordance with a fifth embodiment of the present invention.

FIG. 11 illustrates a fourth embodiment of a modified height sensor, having a projection unit 1100, a detection unit 1110 and a processor 1120. All components shown within these units can be the same as in FIG. 5, except for the differences described below, and the same reference signs are used as in FIG. 5. Compared with the examples of FIGS. 5 and 8, in this example the mirrors 566, 572 and 576 are fixed (or at least they do not move for the purposes of adjusting the reference height for the height sensor). In this example, the position of detection grating 512 is controlled to translate by a variable amount Δdg as shown. The position at which the image of the projection grating 504 falls on the detection grating 512, for a given height zs, is therefore varied, causing the desired change Δzref of the reference height. As indicated by the arrow representing movement Δdg shown on the diagram, the translation direction may be slightly angled relative to the plane of the grating. This is to maintain a constant optical path length and keep the image of the projection grating focused on the detection grating. Other measures can be taken if necessary.

Compared with the examples of FIGS. 5 and 8, the example of FIG. 11 may require only a translation of a single moving element. A complication of the arrangement of FIG. 11, as in the case of FIG. 10, is that the in-plane position of the measurement location 140 (i.e. the position in the x or y direction) becomes variable, relative to the reference frame RF. Accordingly, if the in-plane position of the substrate is scanned in the same way as the conventional height sensor, the measurements obtained will not correspond to the expected locations. This in-plane deviation of the measurement location can be taken into account in a number of ways, as already mentioned for FIG. 10.

An alternative option, illustrated as optional in FIG. 11, is to move both the projection grating 504 and the detection grating 512 by corresponding amounts Δpg and Δdg. If the movements are synchronized, the in-plane deviation of measurement location can be avoided.

Apart from the complication of in-plane deviation of the measurement location, the arrangements for driving and controlling the movable element and for calculating the combined height measurement can be substantially the same as described above for FIG. 5.

FIGS. 12 and 13 illustrate an alternative implementation of a height sensor which does not require moving parts to achieve variable height reference. The height sensor is based on a modified version of a height sensor disclosed in WO2016102127A1 (Reijnders et al). FIG. 12 is copied from WO2016102127A1 to explain briefly the principles of height detection. For further detail, the reader should refer to WO2016102127A1, the entire contents of which is incorporated herein by reference.

FIG. 12 shows how the height sensor again comprises a projection unit 1200, a detection unit 1210 and a processing unit 1220. Similar to the arrangement of FIGS. 5-11, the projection unit 1200 comprises a light source providing a light beam 1202 to which a pattern is imparted by a projection grating 1204. The light source may for example be a broadband light source or a polarized or non-polarized laser beam. By action of the projection grating 1204, a measurement beam 1230 having a periodically varying intensity, having a period P, is obtained. The intensity of the imparted measurement beam varies periodically along a first direction indicated by the arrow 1232. The measurement beam with the periodically varying intensity 1230 is directed towards a measurement location 540 on the substrate. At the measurement location 540, the patterned measurement beam is reflected on the substrate 210 and reflected (1250) towards the detection unit 1210. Note that further optical elements may be provided along the path of the measurement beam between the projection unit 1200 and the detection unit 1210. The reflected patterned measurement beam 1250 having a periodically varying intensity distribution in a second direction, indicated by the arrow 1234, having the same period P.

In contrast to the detection unit 510 of the height sensor of FIG. 5, the detection unit 1210 does not use a detection grating for separating the patterned measurement beam. Rather, the detection unit 1210 comprises a multi-element photodetector 1212 configured to receive the reflected patterned measurement beam having the periodically varying intensity distribution. The multi-element photodetector includes an array of sensing elements 1214, the sensing elements being arranged along the second direction (indicated by the arrow 1234) at a pitch p that is smaller than or equal to half the period P. According to principles of the present disclosure, the pitch p is optionally smaller than one third or one quarter of the period P. Within the meaning of the present disclosure, the pitch p is used to denote the distance between two adjacent sensing elements of the multi-element photodetector, while the pitch P can be considered as the distance between two adjacent peaks in the intensity distribution, when projected onto the multi-element photodetector. For the purposes of this comparison, any magnification or demagnification of the grating pitch in the optical system is ignored, though of course it would be taken into account in a practical embodiment.

The periodically varying intensity distribution is thus directly projected on the multi-element photodetector 1212. As such, a one-to-one correspondence can be noticed between a position along the periodically varying intensity distribution in the second direction and a position along the array of sensing elements in the second direction. The height sensor further comprises a processor 1220 to receive sensor signals from the multi-element photodetector and to determine the height of the substrate based on the one or more sensor signals received from the sensor array.

In an embodiment disclosed in WO2016102127A1, each sensing element is configured to generate a separate output signal, representative of the amount of light received. These output signals are provided to the processing unit 1220. The processing unit 1220 may then, based on the signals received and based on a known position of the sensing elements, determine a height of the substrate, e.g. by determining the average shift or displacement of the intensity pattern of the patterned measurement beam. As an alternative or in addition, a position of a maximum or minimum intensity may be determined and used to determine a height of the substrate. As an alternative to each sensing element providing an output signal, two or more sensing elements may be connected to each other to obtain an output signal representing the combined amount of light received. However it is achieved, grouping the elements into two groups allows signals to be obtained that are similar in function to the signals obtained from the pair of photodetectors 518/519 in the embodiments of FIGS. 5 to 11.

FIG. 13 illustrates the modification of the height sensor of FIG. 12, for applying the principles of the present disclosure to achieve a variable reference height without moving parts. Only the portions of the height sensor that differ from the examples of FIGS. 5 to 11 are shown, with the reflected measurement beam 550 entering the drawing from the bottom left. An enlarged plan view of the multi-element photodetector 1212 is shown, which may be for example a CCD or CMOS image sensor. Individual sensing elements 1214 are arranged (in this example) in a two-dimensional array. One dimension of the array is aligned with the direction of fringes 1302 in the distribution of light in the reflected measurement beam 1250. The direction of the array need not be so aligned, in principle. The array need not be two-dimensional in principle, but could be one dimensional, in which case it would be aligned with the direction of the fringes 1302. The pitch p of the sensing elements in the direction in which the fringes are spaced in this example is a quarter (¼) of the pitch P of the projection grating (when projected onto the multi-element photodetector).

As in the known detector, the signals from the sensing elements are combined into two signals S1 and S2. Asymmetry between these signals will give a measurement of height in the same manner as illustrated in FIG. 3. To achieve variation of the reference height of the height sensor, a variation $\Delta$pix can be applied when selecting which sensing elements to combine to obtain each signal S1, S2. Selector 1304 represents figuratively how the signals from neighboring rows of the array are combined. As mentioned above with reference to FIG. 12, all the signals from the individual sensing elements can be brought to processor 1220 and combined there, or the signals for groups of sensing elements may be combined in the multi-element photodetector if preferred. The described processing, represented schematically in FIG. 13, can be implemented in either way.

While the example of FIGS. 12-13 does not include movable optical elements (at least for implementation of the variable reference height), the arrangements for driving and controlling the movable selection and for calculating the combined height measurement can be substantially the same as described above for FIGS. 5 to 11. A pattern recognition processing in processor 1220 can be applied to detect the position 1306 of the fringe pattern, and to track this in real time as the height sensor measures locations across the substrate. Pattern recognition can be applied to recognize the position of the fringe pattern and derive directly the height measurement including reference height variation, without combining the sensing element signals into two signals S1, S2 in the manner illustrated. It will be appreciated that in the example of FIGS. 12-13, the reference height is adjusted solely by selecting different elements within the multi-element detector. This is not intended to exclude the possibility that one or more optical elements are movable for purposes of calibration or changing between different modes of operation. Rather it is intended to say that there is no need for moving optical elements, in order to adjust the reference height during measurement of heights at one or more locations across the substrate.

Returning to examples with movable optical elements, FIG. 14 presents a last example in which the whole optical system of the height sensor is mounted on one or more sub-frames 1402, which move the whole optical system body with regard to the reference frame. The reference height zref is therefore varied with no disturbance of the optical path. Some elements such as light sources and photodetectors may not need to move, for example if they are coupled to the moving parts of the optical system by optical fibers.

All of the above examples are adaptable to different applications. The U.S. Pat. No. 8,947,632 mentioned above discloses examples where multiple measurement beams scan in parallel across a substrate. When applying the principles of the present disclosure in such a system, the designer will have to choose whether and to what extent the reference height is varied individually for different measurement beams, and what is the best mechanism for doing so, out of the wide variety available. It is possible that the variations in height between the parallel locations are quite small at any given time, compared with the variations experienced at different times in the scanning of the complete substrate. In that case, it may be quite acceptable that all of the parallel beams are measured using the same reference height. Alternatively, for example, a simple tilt of the reference height may be sufficient to bring all the measurement locations within the operating range, rather than requiring full independent control of the reference height for each measurement location.

In all of the above examples, variation of the reference height may include secondary adjustments in addition to the one illustrated above, for example to keep the measurement beam focused at a narrow location on the substrate. The need for these secondary adjustments can be determined in the detailed design of any of the embodiments described herein.

In all of the above examples, instead of controlling the reference height by steering the reference height to a desired setting, the height sensor may operate by scanning the height sensor continually through a range of reference height settings. The effective reference height setting for measurement purposes can be adjusted then by choosing the time at which the measurement is taken, and/or by making a succession of measurements and choosing which one is used. In the embodiments with one or more moving optical elements, for example, the optical elements can be made to vibrate or oscillate through a range of positions, effectively cycling through a range of different reference heights. Either a single height measurement can then be made at an appropriate point in the cycle, or multiple measurements can be made throughout the cycle and the one with the appropriate reference height used later to define the height map.

In these "cycling" embodiments, the measurement location may remain stationary through each cycle, or the height sensor may continue scanning across the substrate, while also cycling more rapidly through the variation of reference heights. In the latter case, as in the examples of FIGS. 9, 10 and 11, the measurement location 540 may become dependent on the selected reference height. Solutions for dealing with this variation of measurement location are described already above.

While the examples described above assume a periodic grating pattern is projected and detected, an arbitrary pattern can be detected in principle, ranging from a single bar or spot to a complex coded pattern. The term "grating" in that regard should be interpreted as any device for applying a recognizable pattern to the radiation used for height sensing, and this applies to the projection grating and detection grating equally.

In conclusion, it has been shown how height measurements on semiconductor substrates or other products can be made over a much wider range of height values, without increasing the fundamental operating range of the height sensor. Accuracy can be maintained and cost of the overall apparatus can be reduced. While specific embodiments of the invention have been described above, it will be appreciated that the invention may be practiced otherwise than as described.

In association with the height sensing hardware, an embodiment may include a computer program containing one or more sequences of machine-readable instructions implementing methods of measurement of the type illustrated above. This computer program may be executed, for example, by a processor 520, 820, 920, 1020, 1120, 1220 or the like which is dedicated to that purpose, or is integrated in the control unit LACU of FIG. 1. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A height sensor comprising:
an optical system configured to deliver radiation to a substrate, to collect radiation reflected from the substrate, and to process the collected radiation to derive a measurement of a surface height of the substrate relative to a reference height, wherein the height sensor comprises an arrangement configured for adjusting the reference height relative to a reference structure to which the optical system is connected, while measuring the surface height at one or more locations across the substrate, wherein the arrangement for adjusting the reference height comprises at least one movable element in said optical system, the at least one movable element being arranged to translate so as to vary the reference height.

2. The height sensor as claimed in claim 1, further comprising:

a controller configured to adjust the reference height automatically at least partly in response to measurements of a position of a substrate support relative to the reference structure.

3. The height sensor as claimed in claim 1, further comprising:

a multi-element detector comprising a plurality of elements and configured and arranged to detect the collected radiation, wherein signals from selected elements are combined to derive the measurement, and wherein the reference height is adjusted at least partially by selecting different elements within the multi-element detector.

4. The height sensor as claimed in claim 3, wherein, while measuring the surface height at one or more locations across the substrate, the arrangement for adjusting the reference height adjusts the reference height solely by selecting the different elements within the multi-element detector.

5. The height sensor as claimed in claim 3, wherein the collected radiation is focused to form an image of a grating pattern on the multi-element detector, and wherein a pitch of elements in the multi-element detector is at least two times a pitch of the grating pattern on the multi-element detector.

6. The height sensor as claimed in claim 1, wherein the at least one movable element in the optical system comprises an element for directing the radiation from a projection focusing subsystem to the substrate.

7. The height sensor as claimed in claim 1, wherein the at least one movable element in the optical system comprises an element for directing the collected radiation from the substrate into a detection focusing subsystem.

8. The height sensor as claimed in claim 1, wherein the at least one movable element is arranged to translate without changing angle, so as to vary the reference height without varying an incidence angle of the radiation at the substrate.

9. The height sensor as claimed in claim 1, wherein the at least one movable element in the optical system is an element for directing the collected radiation from a detection focusing subsystem to a sensor subsystem.

10. The height sensor as claimed in claim 1, wherein the at least one movable element in the optical system is a grating for applying a grating pattern to the radiation delivered to the substrate.

11. The height sensor as claimed in claim 1, wherein an in-plane location at which the height measurement is made, relative to the optical system of the height sensor, is substantially independent of the adjusted reference height.

12. The height sensor as claimed in claim 1, wherein the at least one movable element in the optical system is a detection grating for interacting with a grating pattern in the collected radiation.

13. A method of manufacturing a device wherein a device pattern is applied to a substrate using a lithographic process, the method comprising:

collecting radiation reflected from the substrate using an optical system;

processing the collected radiation to derive a measurement of a surface height of the substrate relative to a reference height;

adjusting the reference height relative to a reference structure to which the optical system is connected while measuring the surface height at one or more locations across the substrate, the adjusting comprising using at least one movable element in the optical system, the at least one movable element being arranged to translate so as to vary the reference height; and focusing the device pattern on a surface of the substrate by reference to heights measured across the substrate.

14. A lithographic apparatus for use in applying a pattern to a substrate, the lithographic apparatus comprising:

a height sensor comprising:

an optical system configured to deliver radiation to a substrate, to collect radiation reflected from the substrate, and to process the collected radiation to derive a measurement of a surface height of the substrate relative to a reference height, and an arrangement configured for adjusting the reference height relative to a reference structure to which the optical system is connected, while measuring the surface height at one or more locations across the substrate, wherein the arrangement for adjusting the reference height comprises at least one movable element in the optical system, the at least one movable element being arranged to translate so as to vary the reference height; and a controller configured for causing the height sensor to measure the height of the substrate surface at locations across the substrate, and for using the measured surface and reference heights to control the focusing of one or more patterns applied to the substrate.

15. The lithographic apparatus as claimed in claim 14, further comprising:

a substrate positioning subsystem configured to position the substrate at least in a height direction with a single degree of coarseness of actuation.

* * * * *